United States Patent [19]
Jones

[11] Patent Number: 5,812,023
[45] Date of Patent: Sep. 22, 1998

[54] VOLTAGE OFFSET COMPENSATION CIRCUIT

[75] Inventor: Keith Lloyd Jones, Pinner, United Kingdom

[73] Assignee: Plessey Semiconductors Limited, United Kingdom

[21] Appl. No.: 604,676

[22] Filed: Feb. 21, 1996

[30] Foreign Application Priority Data

Feb. 21, 1995 [GB] United Kingdom ............... 9503425

[51] Int. Cl.$^6$ ................. H03F 3/45; H03F 1/34
[52] U.S. Cl. ............. 330/9; 327/337; 327/362; 330/51; 330/107
[58] Field of Search ................. 330/9, 51, 107, 330/294; 327/307, 337, 362

[56] References Cited

U.S. PATENT DOCUMENTS

| | | | |
|---|---|---|---|
| 4,282,515 | 8/1981 | Patterson, III | 327/91 X |
| 4,322,687 | 3/1982 | Dwarakanath et al. | |
| 4,438,354 | 3/1984 | Haque et al. | 330/9 X |
| 4,439,693 | 3/1984 | Lucas et al. | 330/9 X |
| 4,962,325 | 10/1990 | Miller et al. | |

*Primary Examiner*—James B. Mullins
*Attorney, Agent, or Firm*—Kirschstein, et al.

[57] ABSTRACT

A voltage offset compensation circuit for a high gain amplifier having a fixed input voltage offset, includes sample and hold circuitry for periodically sampling the offset voltage and gain error voltage of the amplifier, and holding the sampled voltage; storage circuitry, operable between sampling periods, to store the sampled and held voltage; and further circuitry, operable during the sampling periods, to continuously maintain the output of the high gain amplifier at a value that is gain error and voltage offset compensated. The voltage offset compensation circuit may be used in sampled-data circuits, or continuous-time amplifier circuits utilizing either single-ended, or differential, inputs and either single-ended, or differential, outputs.

12 Claims, 3 Drawing Sheets

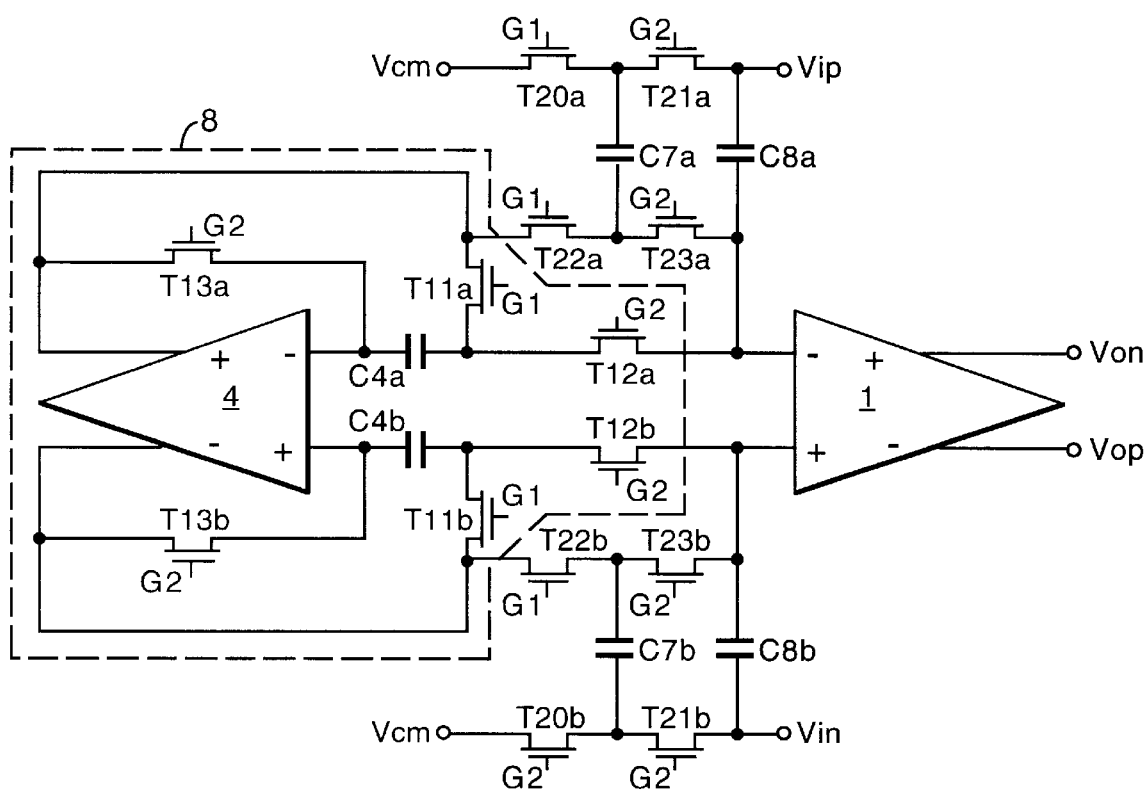

VOLTAGE OFFSET COMPENSATION CIRCUIT

BACKGROUND OF THE INVENTION

The invention relates to a voltage offset compensation circuit having a particular, but not necessarily an exclusive, application in either a sampled-data integrator, or a continuous-time circuit.

The performance of known analogue integrated circuits is affected by unavoidable circuit imperfections and, in particular, the input referred offset voltage of active elements, such as high gain electronic amplifiers. In fact, input offset voltage is a major source of error and drift in circuits, such as, voltage reference circuits.

Compensation techniques for reducing input voltage offset in electronic circuits are known and find application in sampled-data circuits and continuous-time circuits. Compensation techniques which effect a reduction in input voltage offset have the added advantage of effecting a reduction in low frequency noise. Some of the known techniques also compensate for the finite gain of the amplifier which otherwise manifests itself as a gain error.

In some sampled-data circuits, where the output signal of the circuit is only required to be precise during one phase of the clock signal, the circuit can be offset-compensated during the other phase of the clock signal and the known techniques for effecting such compensation give good results. However, in certain sampled-data applications, an offset-compensated output is required during both phases of the clock signal. The known compensation techniques are, therefore, unsuitable for such applications.

In continuous-time circuit applications, a continuously compensated output is normally required but previously devised techniques have one, or more, shortcomings. There are, in fact, a limited number of known techniques for effecting gain error and voltage offset compensation in continuous-time amplifier applications. One such technique is described in an article by M. Cohn entitled 'Chopper Stabilization of MOS operational amplifiers using feed-forward techniques' and published in IEEE JSSC, December 1981.

The Cohn compensating arrangement involves the use of an auxiliary amplifier in a feed-forward approach, but this arrangement requires a large, and therefore external, storage capacitors to avoid circuit stability problems. Also, the recovery time of such a circuit is very long. Since, with this arrangement, the voltage offset cancellation loop includes part of the main amplifier, the design/performance of the main amplifier is adversely affected by the need to maintain circuit stability.

An alternative, more favoured, known technique for effecting offset cancellation in continuous-time applications is that of chopper stabilization. With this technique the polarity of the signal applied to the input of a high gain operational amplifier, and from the output of the amplifier, are synchronously inverted. The result of this is that the voltage offset of the high gain amplifier is converted to an a.c. signal at the output of the amplifier with an average value of zero. Clearly, with such an arrangement, continuous voltage offset compensation is only achieved after filtering of the output of the high gain amplifier. Signal spikes can occur with this technique because the high gain amplifier is momentarily switched out of circuit and errors are produced because the output of the amplifier has to slew from one polarity to the other polarity between each phase of the two-phase clock pulses. Furthermore, this technique does not provide corrections for finite gain errors and cannot be used in single-ended output applications.

Thus, the shortcomings of known offset cancellation techniques include the need to use external components, problems associated with clock related noise, performance compromises in the amplifier design and constraints in application of the known techniques. Furthermore, the fact that the generally preferred chopper-stabilisation technique requires post-filtering to remove signal error components, places demands on the amplifier by requiring its output to slew from one polarity of signal to another between clock cycles, and causes glitches because the amplifier is momentarily out of circuit.

SUMMARY OF THE INVENTION

It is an object of the present invention to provide a voltage offset compensation circuit for effecting voltage offset and gain compensation in sampled-data circuits and continuous-time circuits, whereby the output of the circuit is continuously maintained at a value that is gain error and voltage offset compensated.

The invention provides a voltage offset compensation circuit for a high gain amplifier having a fixed input voltage offset, the said circuit including sample and hold means for periodically sampling the offset voltage and the gain error voltage of the amplifier, and for holding the sampled voltage; storage means operable between sampling periods to store the sampled and held voltage; and further means operable during the sampling periods to continuously maintain the output of said high gain amplifier at a value that is gain error and voltage offset compensated.

In accordance with one aspect of the present invention, the sample and hold means are adapted to periodically sample the offset voltage and gain error voltage at either, or both, of the inputs of the high gain amplifier. With this arrangement the storage means are adapted to store the sampled and held voltage of either, or both, of the inputs of the high gain amplifier.

In accordance with another aspect of the present invention, the sample and hold means include a further amplifier and, for each input of the high gain amplifier, coupling means for capacitively coupling an input of said high gain amplifier to a respective input of the further amplifier during the sampling periods, and connection means for connecting the sampled and held voltage to said storage means between sampling periods.

The voltage offset compensation circuit may be used in sampled-data circuits, or continuous-time amplifier circuits utilising either single-ended, or differential, inputs and either single-ended, or differential, outputs.

With a circuit having a single-ended input and a single-ended output, the other inputs of the high gain amplifier and further amplifier are connected to a voltage source.

With a circuit having differential inputs and differential outputs, the sample and hold means include coupling means for capacitively coupling each input of the further amplifier to a respective input of the high gain amplifier during the sampling periods, and connection means for connecting, between sampling periods, the said sampled and held voltage for each input of said high gain amplifier to respective storage means. With this arrangement, the storage means are adapted to store the sampled and held voltage at each input of said high gain amplifier, and the further means are adapted to continuously maintain each output of the high gain amplifier at a value that is gain error and voltage offset compensated.

BRIEF DESCRIPTION OF THE DRAWINGS

The foregoing and other features according to the present invention will be better understood from the following description with reference to the accompanying drawings, in which:

FIG. 5 diagrammatically illustrates the circuit diagram for a voltage offset compensation circuit, according to the present invention, as part of another offset-compensated continuous-time amplifier.

DETAILED DESCRIPTION OF THE PREFERRED EMBODIMENTS

Figure 1:
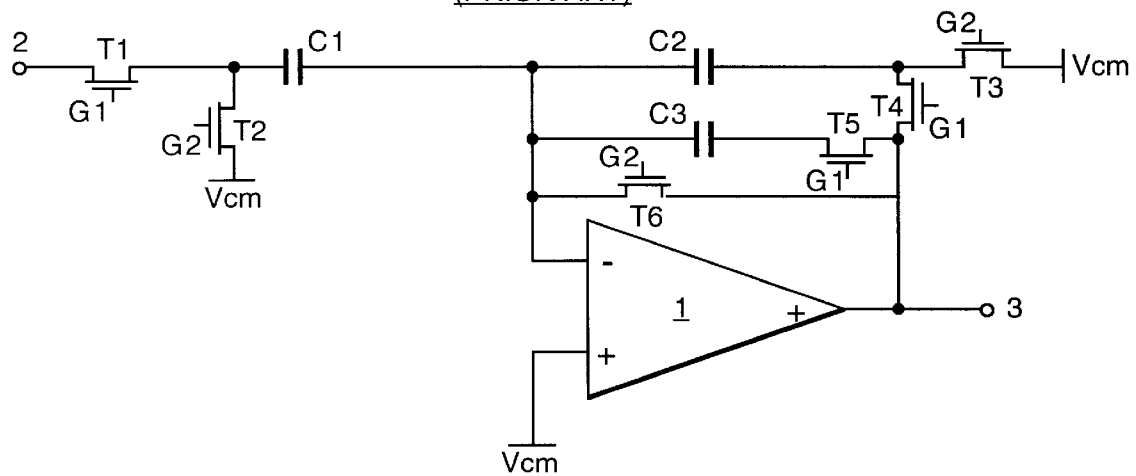
FIG. 1 diagrammatically illustrates the circuit diagram for a known sampled-data integrator using standard voltage offset compensation techniques according to the prior art.

The usual method of compensating for voltage offset in sampled data circuits involves the use of the so-called double-correlated-sampling technique. By way of illustration, FIG. 1 of the accompanying drawings shows this known sampling technique applied to a standard configuration of integrated circuit. In FIG. 1, one input (−ve) of a high gain amplifier 1 is connected to an input terminal 2 via a capacitor C1 and a field effect transistor T1, the junction of the capacitor C1 and transistor T1 being connected to a voltage source Vcm via a field effect transistor T2. The amplifier input (−ve) is also connected to the voltage source Vcm via a capacitor C2 and a field effect transistor T3. The junction of the capacitor T3 and capacitor C2 is connected via a field effect transistor T4 to an output terminal 3 of the high gain amplifier 1. A capacitor C3 is connected in series with a field effect transistor T5 and in parallel with a field effect transistor T6 between the output terminal 3 and the amplifier input (−ve). The other input of the amplifier 1 is connected to the voltage source Vcm. The transistors T1 to T6 are preferably provided by MOS (metal-oxide-silicon) transistors.

The voltage source Vcm is the common-mode, or reference potential, for the circuit and would typically be the midpoint of the voltage supply.

The gate electrodes G1 and G2 of the transistors T1 to T6 are connected to a two-phase output of a clock pulse generator (not illustrated), the clock pulses being applied to gates G1 during one phase, i.e. the first phase, of the two-phase output of the clock pulse generator to effect operation of the transistors T1, T4 and T5, i.e. the transistors are rendered conductive, whereas the clock pulses applied to the gates G2 during the other phase, i.e. the second phase, of the two-phase output of the clock pulse generator effect operation of the transistors T2, T3 and T6. In the absence of a clock pulse, the transistors are non-conductive, i.e. effectively an open-circuit. Thus, during the second phase of the clock pulses, the transistors T1, T4 and T5 are open-circuit, the transistors T2, T3 and T6 are switched to the closed-circuit mode, and the output of the amplifier 1 is connected directly to the input via the transistor T6, i.e. a short-circuit connection is established between the input and the output of the amplifier 1. This causes the fixed voltage offset at the input of the amplifier 1 to be stored on the sampling capacitors C1 and C2 which are each connected on one side thereof to the voltage source Vcm respectively via the transistors T2 and T3. During the next phase of the clock pulses, i.e. the first phase, the transistors T1, T4 and T5 are in the closed-circuit mode and the transistors T2, T3 and T6 are in the open-circuit mode. This causes said one sides of the capacitors C1 and C2 to be respectively connected to the input terminal 2 via the transistor T1, and the output terminal 3 via the transistor T4. The result of this is to effectively subtract the voltage offset of the amplifier 1 from the input signal so that no errors, due to amplifier offset, appear at the output terminal 3. This technique does not, however, compensate for errors due to finite amplifier gain and, in addition, the output of the amplifier 1 has to slew from its offset voltage to the output signal voltage, and conversely between each phase of the clock pulses.

Known techniques for effecting finite amplifier gain compensation in sampled-data circuits have the additional advantage of reducing the change in output voltage between each phase of the clock pulses. However, all of these known techniques remove the effect of the amplifier voltage offset only during one phase of the clock pulses and the amplifier is connected in a high bandwidth mode so that the wide-band noise of the main amplifier is sampled during the voltage offset storing phase (aliasing), resulting in trade-offs between circuit speed and circuit noise.

With the voltage offset compensation circuit according to the present invention, the voltage offset is cancelled during both phases of the clock pulses and the effects of finite amplifier gain are also corrected. The circuit diagram for the voltage offset compensation circuit according to the present invention is diagrammatically illustrated in FIG. 2 of the accompanying drawings, as part of a sampled-data integrator.

Figure 2:
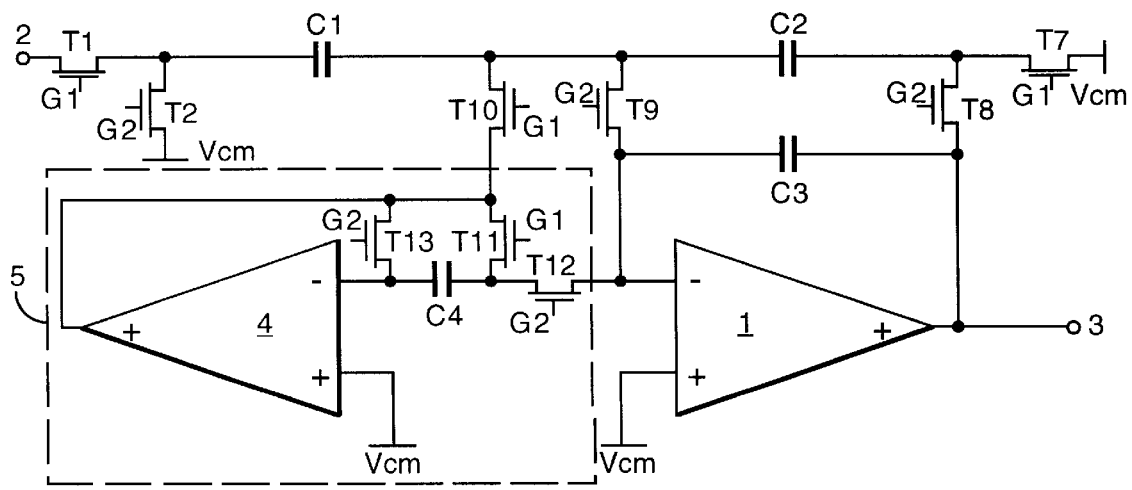
FIG. 2 diagrammatically illustrates the circuit diagram for a voltage offset compensation circuit, according to the present invention, as part of a sampled-data integrator.

That part of the circuit which comprises the components C1, T1 and T2 is the same as the corresponding circuit in FIG. 1 of the drawings. In FIG. 2, the capacitors C2 and C3 are connected in parallel via field effect transistors T8 and T9 across the input (−ve) and output of the high gain amplifier 1. A field effect transistor T7 connects the capacitor C2 to the voltage source Vcm. An auxiliary amplifier 4 has its input (−ve) capacitively coupled to the input (−ve) of the amplifier 1 via a field effect transistor T12, the capacitive coupling being effected by a capacitor C4. The other inputs of the amplifiers 1 and 4 are connected to the voltage source Vcm. The output of the amplifier 4 is connected directly to its input via a field effect transistor T13 and to the junction of two field effect transistors T10 and T11 which are connected in series between the junction of the capacitors C1 and C2 and the junction of the capacitor C4 and transistor T12.

It will be seen from FIG. 2 that the clock pulses will be applied to the transistors T1, T7, T10 and T11 via the gates G1 during the first phase of the clock pulses and to the transistors T2, T8, T9, T12 and T13 via gates G2 during the second phase of the clock pulses.

It will also be seen from the following description that the use of the auxiliary amplifier 4, in which the signal being processed is substantially constant between each phase of the clock pulses, enables the amplifier bandwidth to be less than that of the high gain amplifier 1 thereby giving rise to lower noise performance than known voltage offset and gain compensation techniques.

With the basic integrator circuit of FIG. 2 of the drawings, the voltage offset at the input of the amplifier 1 is sampled during the second phase of the clock pulses by the offset-cancelled sample and hold circuit enclosed by the dashed lines 5. During this phase, transistors T2, T8, T9, T12 and T13 are in closed-circuit mode thereby causing the input (−ve) of amplifier 1 to be connected to the input of amplifier 4 via the transistor T12 and capacitor C4, and the output of the amplifier 4 to be connected directly to its input via the transistor T13. The effect of this is that the voltage offset at the input of the amplifier 1 charges the capacitor C4, the offset voltage being held on that side of the capacitor C4 which is connected to the transistor T12. Thus, the circuit enclosed by the dashed line 5 samples and holds the offset voltage during the second phase of the clock pulse. In addition, during the sampling phase, the capacitors C2 and C3 are connected in parallel across the input and output of the amplifier 1 and the capacitor C3, which is a voltage offset integration capacitor, holds the output of the amplifier 1 at a value which is gain and offset corrected.

During the first phase of the clock pulses, i.e. the hold phase, the transistors T1, T7, T10 and T11 are in the closed-circuit mode and the transistors T2, T8, T9, T12 and T13 are open circuit. The effect of this is that the side of the capacitor C4, on which the offset voltage is held, is connected directly to the junction of the capacitors C1 and C2 via the transistors T10 and T11, the capacitors C1 and C2 are connected in series between the input terminal 2 and the voltage source Vcm by means of the transistors T1 and T7, and the capacitor C2 is disconnected from the capacitor C3. Thus, the charge transfer capacitors C1 and C2 are charged to the output voltage of the sample and hold circuit, which has a value equal to the sum of the offset voltage of the amplifier 1 and the signal gain error term. During the next phase of the clock pulse, the input voltage is scaled by the capacitor ratios and transferred to the output of the amplifier 1 without any error due to amplifier offset, or finite gain error.

Since the voltage offset of amplifier 1 is constant between each phase of the clock pulses and the gain error voltage is relatively small, the input of the sample and hold amplifier 4 and the charge on the sample and hold capacitors are practically constant between each phase of the clock pulses. A result of this is that the output of the sample and hold amplifier 4 need only change by an amount equal to the difference of the small input offset voltages of the two amplifiers. In addition, the sample and hold circuit of FIG. 2 of the drawings can optionally be clocked at a sub-multiple of the clock frequency used in the main circuit. These considerations allow a relatively low-noise, low-bandwidth auxiliary amplifier 4 to be used. Clearly, the sample and hold circuit of FIG. 2 of the drawings is also sampling the low frequency noise of the amplifier 1 and this additionally provides low frequency noise reduction.

In practice, fully-differential circuit techniques are used to prevent switch charge injection offset effects and the sample and hold circuit of FIG. 2 of the drawings is adapted to be fully differential, irrespective of the type of signal traversing the high gain amplifier 1. For different applications, the high gain amplifier 1 could have single-ended, or differential, input signals and single-ended, or differential, output signals, giving four possible combinations for the circuit. Each of these combinations are encompassed by the circuit diagram diagrammatically illustrated in FIG. 3 of the accompanying drawings. This circuit is a general-purpose circuit. Clearly, specific high gain amplifier 1 circuits could be implemented for each type of application. However, the area penalty in having such a multi-purpose circuit is small. Both p-type and n-type transistors are used in the circuit of FIG. 3 for the switching function provided by transistors T1, T2, T7 and T8 which are assumed to handle bipolar signals, and the amplifier 1 is of a type which can be simply modified to give either single-ended, or differential outputs.

It is known by persons skilled in the art that, when designing integrated circuits, capacitors match better than resistors. Furthermore, the impedance of such capacitors is much higher than resistors of the same area, over the usual signal ranges of interest, and this makes the bypassing of such components by transmission gates, i.e. the switchable field effect transistors of FIGS. 2 and 3 of the accompanying drawings, much easier. The bypassing of passive components is used, for example, in variable gain amplifiers.

Figure 4:
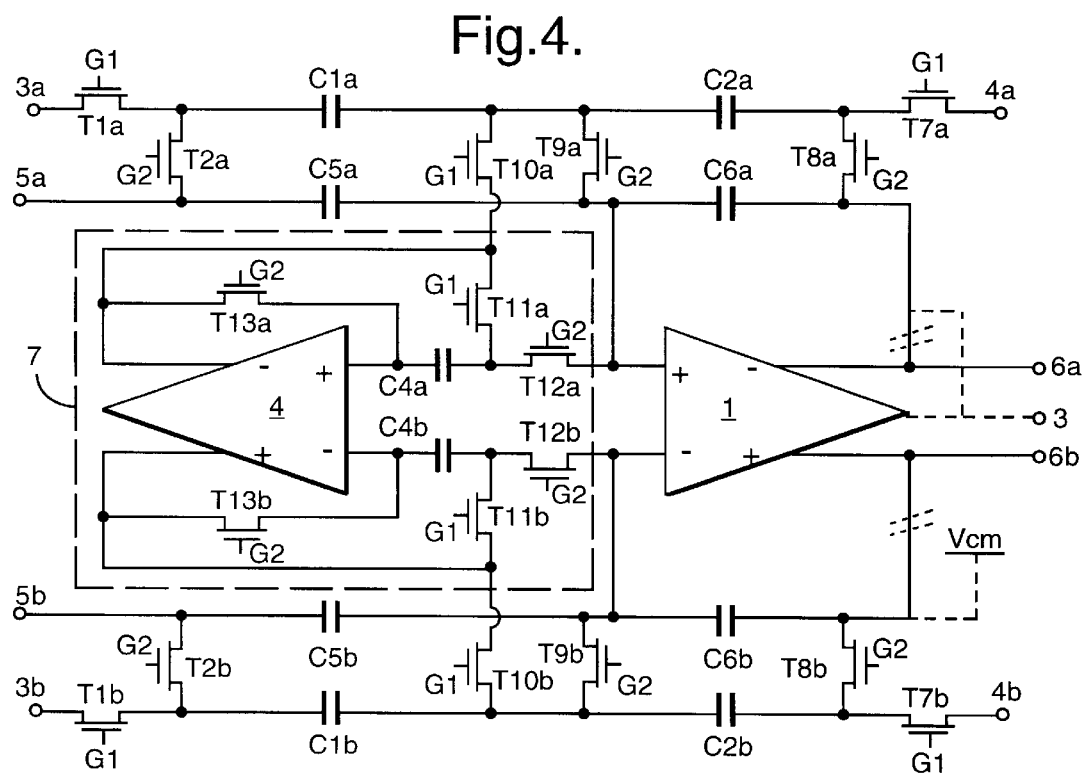
FIG. 4 diagrammatically illustrates the circuit diagram for a voltage offset compensation circuit, according to the present invention, as part of a precision voltage offset compensated continuous-time amplifier.

A voltage offset-compensated, finite-gain-compensated, precision amplifier, including the sample and hold circuit of FIG. 2 of the accompanying drawings, is diagrammatically illustrated in FIG. 4 of the accompanying drawings.

It will be seen from FIG. 4 of the drawings that the continuous-time precision amplifier includes an offset-cancelled, fully-differential, sample and hold circuit which is enclosed by the dashed line 7. As with the similar circuit of FIG. 2 of the drawings, the FIG. 4 sample and hold circuit includes an auxiliary amplifier 4 and associated circuitry provided by field effect transistors T11$a$/T11$b$, T12$a$/T12$b$ and T13$a$/T13$b$ and capacitors C4$a$/C4$b$. Thus, with this arrangement, both inputs of the high gain amplifier 1 are capacitively coupled to respective ones of the inputs of the auxiliary amplifier 4 respectively via the transistor T12$a$ and the capacitor C4$a$, and the transistor T12$b$ and the capacitor C4$b$. The sample and hold circuit of FIG. 4 of the accompanying drawings operates, during each phase of the two-phase clock pulses, in a manner similar to that described in relation to FIG. 2 of the drawings, i.e. during the sampling phase, the capacitors C4$a$ and C4$b$ are respectively charged via the transistors T12$a$ and T12$b$ to a level whereby a voltage, corresponding to the voltage offset and gain error of the amplifier 1, is held on the plate of each capacitor, remote from the input of the auxiliary amplifier 4, during the hold phase. This voltage charges floating capacitors C1$a$/C1$b$, C2$a$/C2$b$, i.e. by the switching of the transistors T1$a$/T1$b$, T7$a$/T7$b$, T10$a$/T10$b$, and T11$a$/T11$b$, into the closed-circuit mode, during the first phase of the two-phase clock pulses, the transistors T2$a$/T2$a$, T8$a$/T8$b$, T9$a$/T9$b$ and T13$a$/T13$b$ being in the open-circuit mode and cause the voltage, corresponding to the voltage offset and gain error of the amplifier 1, to be applied to the junction of the capacitors C1$a$ and C2$a$ which are connected in series between the terminals 3$a$ and 4$a$, and to the junction of the capacitors C1$b$ and C2$b$ which are connected in series between the terminals 3$b$ and 4$b$. This results in charging of the capacitors C1$a$, C1$b$, C2$a$, C2$b$.

Thus, during operation of the circuit, the voltage at the inputs of the high gain amplifier 1 is sampled by the sample and hold circuit, enclosed by the dashed line 7, during the second phase of the two-phase clock pulses, and is then transferred onto the floating capacitors C1$a$/C1$b$ and C2$a$/C2$b$ during the first phase of the two-phase clock pulses. During the next occurrence of the second phase clock pulses, the floating capacitors C1$a$, C1$b$, C2$a$ and C2$b$ are respectively connected in parallel with gain setting capacitors C5$a$, C5$b$, C6$a$ and C6$b$ by the transistors T2$a$, T2$b$, T8$a$, T8$b$, T9$a$ and T9$b$, which are switched, during this phase, to the closed-circuit mode. This procedure effectively drives the junctions of the capacitors C5$a$/C6$a$ and C5$b$/C6$b$ to the input offset voltage of the high gain amplifier 1 and the output of amplifier 1 to a value which is gain and offset compensated. A filtering function can be effected by making the value of the gain setting capacitors much higher than the value of the floating capacitors.

Since the offset voltage of the amplifier 1 is constant between clock phases and the gain error voltage is very small, it follows that the sample and hold amplifier input, and the charge on the sample and hold capacitors, are practically constant between clock phases.

Furthermore, the sample and hold amplifier output need only change by an amount equal to the difference of the small input offset voltages of the two amplifiers. In addition, the clock frequency need not be very high. These considerations allow a relatively low-noise, low-bandwidth auxiliary amplifier 4 to be used in combination with a relatively low clock rate. This acts to reduce sampled noise and other clock related effects. The filtering function determined by the capacitors provides an in-built filtering function which will further reduce the effect of auxiliary circuit noise to very low levels.

The function of the circuit of FIG. 4 of the drawings also acts to reduce the low frequency noise of the high gain amplifier 1 and, therefore, that of the whole circuit. The use of separate common-mode reference voltages Vicm (terminals 3a, 3b) and Vocm (terminals 4a, 4b) will allow precision level shifting, if this is required, between these potentials, otherwise they can be of the same value.

The circuit diagrammatically illustrated in FIG. 4 of the drawings is multi-purpose in that it can be used for applications having signals which provide either single-ended, or differential, inputs and require either single-ended, or differential, outputs. The main amplifier is of a type that can be easily configured to have single-ended, or differential, outputs. Specific circuits could be used for each type of application but the area penalty of the described approach is small. With single-ended inputs either Vin or Vip is connected to Vcm.

Another voltage offset-compensated, finite-gain-compensated, continuous-time amplifier, including the sample and hold circuit of FIG. 2 of the accompanying drawings, is diagrammatically illustrated in FIG. 5 of the accompanying drawings. It will be seen from FIG. 5 that only the basic high gain amplifier 1 is shown together with the sample and hold circuit, enclosed by the dashed line 8, and the additional components for storing the sampled and held voltage between sampling periods, and for continuously maintaining the output of the high gain amplifier 1 at a value that is gain error and voltage offset compensated. The circuit behaves, in total, as a near ideal gain and offset compensated amplifier to which additional components are added to define the required circuit function.

The additional components, associated with each input of the high gain amplifier 1, include field effect transistors T20 and T21 connected in series between a voltage source Vcm and an input terminal (Vip/Vin), field effect transistors T22 and T23 connected in series between an input of the high gain amplifier 1 and a respective output of the auxiliary amplifier 4, a capacitor C7 connected between the junction of the transistors T20 and T21, and the junction of transistors T22 and T23, and a capacitor C8 connected between the input of the amplifier 1 and the input terminal (Vip/Vin).

Thus, in operation, the signal at the terminals of the high gain amplifier 1 is periodically sampled, in a manner as previously outlined, by the sample and hold circuit 8, i.e. during the second phase of the two-phase clock pulses, and thereby results in the capacitors C4a and C4b being respectively charged via the transistors T12a and T12b to a level whereby a voltage, corresponding to the voltage offset and gain error of the amplifier 1, is held on the plate of each capacitor, remote from the input of the auxiliary amplifier 4, during the hold phase. During the first phase of the two-phase clock pulses, the clock pulses applied to the gates G1 of transistors T20a/T20b, T22a/T22b and T11a/T11b will cause these transistors to be conductive, i.e. switched to the closed circuit mode, and thereby cause the capacitors C7a and C7b to be connected in series between the voltage source Vcm and the output of the sample and hold circuit 8. This will result in storage of the sampled and held voltage on floating capacitors C7a and C7b. During the next phase of the clock pulses, i.e. the second phase, the clock pulses applied to the gates G2 of the transistors T21a/T21b, T23a/T23b will cause these transistors to be conductive and the capacitors C7a and C7b will be respectively connected in parallel with capacitors C8a and C8b. This will result in the potential on the plates of the capacitors C8a and C8b which are respectively connected to the input terminals Vip and Vin, to be forced to the potential of the voltage source Vcm and the potential on the plates of the capacitors C8a, C8b which are connected to high gain amplifier 1 to be forced to the input offset voltage of amplifier 1. As a consequence of this, the total amplifier circuit will appear as an ideal amplifier with no voltage offset and without any finite gain errors.

Since the voltage offset of the high gain amplifier 1 is constant between clock phases and the gain error voltage is very small, it follows that the input of the auxiliary amplifier 4 and the charge on the sample and hold capacitors C4a and C4b are practically constant between clock phases. Also, the output of the auxiliary amplifier 4 need only change by an amount equal to the difference of the small input offset voltages of the two amplifiers 1 and 4. In addition, the clock frequency need not be very high. These considerations allow a relatively low noise, low-bandwidth auxiliary amplifier 4 to be used in combination with a relatively low clock rate. This acts to reduce sampled noise and other clock related effects. Making C7a and C7b much less than C8a and C8b provides an in-built filtering function which will further reduce the effect of auxiliary circuit noise to very low levels.

The function of the circuit of FIG. 5 also acts to reduce the effect of low frequency noise in the main amplifier and therefore that of the whole circuit.

Whilst the offset-compensated continuous-time amplifier circuit of FIG. 5 includes a high gain amplifier 1 with a differential output, the offset compensation techniques would work equally well with a single-ended output amplifier, changes only being necessary to the output stage of the amplifier 1.

Figure 3:
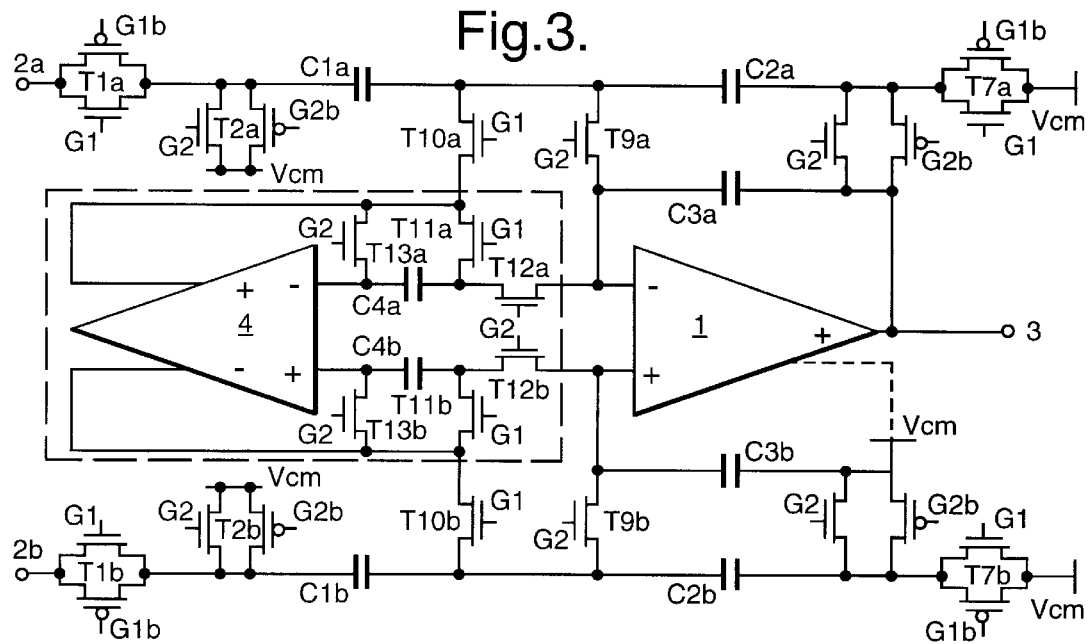
FIG. 3 diagrammatically illustrates the circuit diagram for a voltage offset compensation circuit, according to the present invention, as part of a general-purpose sampled-data integrator.

As with the circuit of FIG. 2 of the accompanying drawings, the field effect transistors of FIGS. 3 to 5 of the accompanying drawings are preferably provided by MOS transistors.

I claim:

1. A voltage offset compensation circuit for a high gain amplifier having an input voltage offset, said compensation circuit including sample and hold means for periodically sampling said voltage offset of the amplifier and for holding the sampled voltage, said sample and hold means comprising a further amplifier and coupling means for capacitively coupling an input of said high gain amplifier to an input of the further amplifier during sampling periods; storage means operable between the sampling periods to store the sampled and held voltage; and further means operable during the sampling periods to continuously maintain an output of said high gain amplifier at a value that is voltage offset compensated.

2. A compensation circuit as claimed in claim 1 wherein the coupling means include, for each input of the high gain amplifier, a first capacitor connected in series with first switching means between said input of said high gain amplifier and the respective input of the further amplifier, wherein said first switching means is interposed between said first capacitor and said input of said high gain amplifier and is adapted to connect the capacitor to the high gain amplifier input only during the sampling periods, and wherein said input of the further amplifier is connected to a respective one of its outputs by second switching means adapted to effect a direct connection between said input and output of the further amplifier only during the sampling periods.

3. A compensation circuit as claimed in claim 2 wherein said coupling means include third switching means adapted to connect the junction of said first capacitor and said first switching means, and the said output of the further amplifier, to said storage means between sampling periods only.

4. A compensation circuit as claimed in claim 3 wherein said storage means include, for each input of the high gain amplifier, second and third capacitors connected in series, each of the capacitors being connected on one side thereof to said third switching means, wherein the other sides of said second and third capacitors are respectively connected to an input terminal of the compensation circuit and to a voltage source by fourth switching means that are adapted to operate between the sampling periods only, wherein said other side of the second capacitor is connected to said voltage source by fifth switching means that are adapted to operate only during the sampling periods, and wherein the third capacitor is connected in parallel with said further means via sixth switching means that are adapted to operate only during the sampling periods.

5. A compensation circuit as claimed in claim 4 wherein said further means include, for each input of the high gain amplifier, a fourth capacitor connected between said input and a respective output of said high gain amplifier.

6. A compensation circuit as claimed in claim 5 wherein said storage means include, for each input of the high gain amplifier, a fifth capacitor connected on one side thereof to said third switching means, wherein said fifth capacitor is connected at the other side thereof to said voltage source by seventh switching means that are adapted to operate between the sampling periods only, and wherein said fifth capacitor is connected in parallel with said further means via eighth switching means that are adapted to operate only during the sampling periods.

7. A compensation circuit as claimed in claim 6 wherein said further means include, for each input of the high gain amplifier, a sixth capacitor connected between an input of said high gain amplifier and a respective input of the compensation circuit, and wherein said fifth and sixth capacitors are connected in parallel by said eighth switching means during the sampling periods.

8. A compensation circuit as claimed in claim 4 wherein said compensation circuit includes gain setting means including, for each input of the high gain amplifier, series connected capacitors each one of which is connectable in parallel with respective ones of the second and third capacitors only during the sampling periods, and wherein that one of the series connected capacitor of the gain setting means which is connected in parallel with the third capacitors forms said further means.

9. A compensation circuit as claimed in claim 3 wherein said switching means include field effect transistors.

10. A compensation circuit as claimed claim 9 wherein the field effect transistors are MOS transmission.

11. A voltage offset compensation circuit for a high gain differential input—differential output amplifier having input voltage offsets, said compensation circuit including sample and hold means for periodically sampling said voltage offsets and for holding the sampled voltages, said sample and hold means comprising a further differential amplifier and coupling means for capacitively coupling each input of the high gain differential amplifier to a respective input of the differential further amplifier during sampling periods; respective storage means operable between the sampling periods to store the sampled and held voltages for each input of the high gain differential amplifier; and further means operable during the sampling periods to continuously maintain outputs of said differential high gain amplifier at values that are voltage offset compensated.

12. A compensation circuit as claimed in claim 11 wherein said storage means are adapted to store the sampled and held voltage at each input of said high gain amplifier, and wherein said further means are adapted to continuously maintain each output of the high gain amplifier at a value that is gain error and voltage offset compensated.

* * * * *